(12) United States Patent
Guo

(10) Patent No.: US 9,409,204 B2
(45) Date of Patent: Aug. 9, 2016

(54) MASK

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Jian Guo, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 14/546,237

(22) Filed: Nov. 18, 2014

(65) Prior Publication Data

US 2015/0336129 A1  Nov. 26, 2015

(30) Foreign Application Priority Data

May 21, 2014  (CN) .......................... 2014 1 0216482

(51) Int. Cl.
   B05C 21/00    (2006.01)
   H01L 21/308   (2006.01)
   G03F 1/42     (2012.01)
   G03F 1/70     (2012.01)
   G03F 1/44     (2012.01)

(52) U.S. Cl.
   CPC .............. *B05C 21/005* (2013.01); *G03F 1/44* (2013.01); *G03F 1/42* (2013.01); *G03F 1/70* (2013.01); *H01L 21/308* (2013.01); *H01L 2224/10135* (2013.01)

(58) Field of Classification Search
   CPC ................ B05C 21/005; H01L 2224/10135; H01L 2224/10165; H01L 2224/8113; H01L 2224/81132; H01L 21/308; G03F 1/42; G03F 1/70; G03F 1/38; G03F 7/2045; G03F 1/44; G02B 2006/12173
   See application file for complete search history.

(56) References Cited

U.S. PATENT DOCUMENTS

| 4,308,586 A * | 12/1981 | Coates ............... G01B 11/0625 |
| | | 356/504 |
| 2006/0105250 A1* | 5/2006 | Liu .......................... G03F 1/14 |
| | | 430/5 |
| 2008/0076037 A1* | 3/2008 | Yang ..................... G03F 9/7076 |
| | | 430/5 |

* cited by examiner

*Primary Examiner* — Julio J Maldonado
*Assistant Examiner* — Farun Lu
(74) *Attorney, Agent, or Firm* — Nath, Goldberg & Meyer; Joshua B. Goldberg; Christopher Thomas

(57) ABSTRACT

The present invention provides a mask, on which a preset pattern is provided. First test patterns for determining an amount of a position offset of the mask during its movement are provided on the mask at a first side of the preset pattern and a second side of the preset pattern opposite to the first side, respectively. When being moved in a direction from the first side to the second side by a standard distance, the mask can determine whether a position offset occurs to the mask during its movement, and determine an amount of the position offset if a position offset occurs. Thus, the position offset of the mask can be corrected, thereby obtaining an accurate predetermined pattern on a glass substrate.

9 Claims, 8 Drawing Sheets

US 9,409,204 B2

MASK

CROSS-REFERENCE TO RELATED APPLICATIONS

The present application claims the priority of Chinese Patent Application No. 201410216482.4, filed on May 21, 2014, the contents of which are incorporated herein in their entirety by reference.

FIELD OF THE INVENTION

The present invention relates to the field of semiconductor manufacturing technology, and in particular, relates to a mask.

BACKGROUND OF THE INVENTION

In a cell forming process of a TFT LCD, a region of a glass substrate where a frame sealant is coated needs to be irradiated with ultraviolet (UV) light, so as to cure the frame sealant. Meanwhile, in the above process, another glass substrate having a predetermined pattern needs to be used to shade the remaining region of the above glass substrate, so as to prevent a photoresist coated on the remaining region from being cured.

In the prior art, a process for manufacturing a glass substrate having a predetermined pattern includes steps of: S1: depositing an opaque metal layer on a glass substrate and coating a layer of photoresist on the opaque metal layer; S2: exposing a region of the glass substrate which corresponds to the predetermined pattern by using a mask, so as to denature the photoresist coated on the region which corresponds to the predetermined pattern; S3: developing the exposed region of the glass substrate to remove the denatured photoresist; S4: etching the glass substrate to remove portions of the opaque metal layer where the photoresist has been removed, so as to form the predetermined pattern on the glass substrate; and S5: removing the remaining photoresist on the glass substrate, so as to obtain the opaque metal layer in the region other than the predetermined pattern as a light blocking zone.

Specifically, in the above step S2, multiple exposures may be successively performed on a plurality of regions of the glass substrate to denature the photoresist on the region corresponding to the predetermined pattern through steps of: S21: shading most region of a glass substrate 2 at lower right side by using a rectangular mask 1, as shown in FIG. 1; S22: exposing the upper region and the left region of the glass substrate 2, as shown in FIG. 2; S23: moving the rectangular mask 1 (the rectangular mask 1 is moved upward as shown in FIG. 3), and a light blocking strip 3 of an exposure apparatus is used for shading desired regions of the glass substrate 2, as shown in FIG. 3; S24: exposing the unshaded region of the glass substrate 2, as shown in FIGS. 4; and S25: repeating the steps S23 and S24 to obtain the glass substrate 2 as shown in FIG. 5, and repeating the steps S23 and S24 many times to finally obtain the glass substrate 2 as shown in FIG. 6.

During the above process for manufacturing the glass substrate 2 having the predetermined pattern, the rectangular mask 1 needs to be repeatedly moved to shade a desired region of the glass substrate 2. However, in practical applications, it is difficult to move the mask exactly to the desired position. Thus, there is generally a position offset between a desired position and an actual position of the mask. The position offset will cause a region corresponding to a portion of the desired predetermined pattern not to be exposed or cause a portion of a region which should not be exposed to be exposed, resulting in a certain error between a pattern formed on the glass substrate and the desired predetermined pattern (for the glass substrate manufactured through the above-described process, the error may be a case where a distance a (as shown in FIG. 6) between two adjacent light blocking zones cannot maintain a desired value). Therefore, in practical applications, a position offset of the mask during its movement needs to be detected, so as to correct the position offset, so that a pattern formed on the glass substrate can be consistent with the desired pattern as much as possible.

SUMMARY OF THE INVENTION

The present invention intends to solve at least the above technical problem in the prior art. The present invention provides a mask, which can detect a position offset generated during its movement, to correct the position offset, so that a pattern obtained on a glass substrate can be consistent with a desired predetermined pattern.

To achieve the object of the present invention, there is provided a mask, on which a preset pattern is provided. First test patterns for determining an amount of a position offset of the mask during its movement are provided on the mask at a first side of the preset pattern and a second side of the preset pattern opposite to the first side, respectively.

Preferably, at least one of the first test patterns is provided with a plurality of tags which are arranged in a first direction from the first side to the second side, and the tags in the first test pattern located at the first side and the tags in the first test pattern located at the second side are mirror-symmetric with respect to the first direction.

Preferably, each of the first test patterns is provided with a plurality of tags which are arranged in a first direction from the first side to the second side, and the tags in the first test pattern located at the first side and the tags in the first test pattern located at the second side are mirror-symmetric with respect to the first direction.

Preferably, the plurality of tags have different preset widths, and the preset widths of the tags in each of the first test patterns progressively increase or progressively decrease in the first direction.

Preferably, the preset pattern is provided on a central portion of the mask.

Preferably, a portion between any two adjacent tags in each of the first test patterns forms an opening, and opening directions of a plurality of formed openings are the same.

Preferably, widths of the plurality of openings are the same.

Preferably, the first direction is perpendicular to the opening direction of the plurality of openings.

Preferably, widths of the tags in each of the first test patterns range from 1.0 μm to 3.0 mm.

Preferably, the preset pattern is a rectangle.

Preferably, a plurality of second test patterns are further provided in a peripheral region of the mask, each of the plurality of second test patterns includes a plurality of figures having different sizes, and the plurality of figures are used for determining an exposure intensity.

Preferably, all of the plurality of figures are rectangles or circles.

Preferably, sizes of the plurality of figures range from 1.0 μm to 3.0 mm.

The advantageous effects of the present invention are as follows:

When being moved in a direction from a first side of a preset pattern to a second side of the preset pattern opposite to the first side by a standard distance, the mask according to the present invention can determine whether a position offset occurs during its movement, by determining whether an actual correspondence relationship between a position of the first test pattern located at the first side after the mask is moved and a position of the first test pattern located at the second side before the mask is moved is consistent with a preset correspondence relationship or not. If they are determined to be consistent, it is determined that no position offset occur to the mask during its movement. If they are determined to be inconsistent, it is determined that a position offset occurs to the mask during its movement, and an amount of the position offset of the mask during its movement can be determined by determining a change value of the actual correspondence relationship relative to the preset correspondence relationship. Thus, the position offset of the mask can be corrected according to the amount of the position offset, thereby obtaining an accurate predetermined pattern on a glass substrate.

DETAILED DESCRIPTION OF THE EMBODIMENTS

For better understanding of the technical solutions of the present invention by a person skilled in the art, a mask according to the present invention will be described below in detail with reference to the accompanying drawings.

Figure 1:
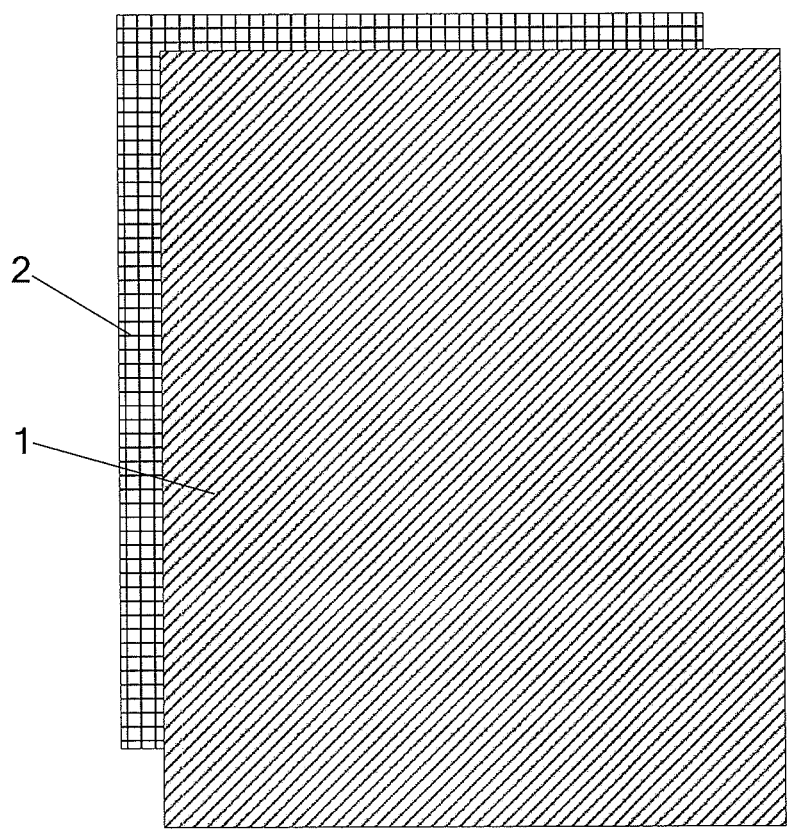
FIG. 1 is a schematic view of shading most region of a glass substrate at the lower right side by using a mask.
Figure 2:
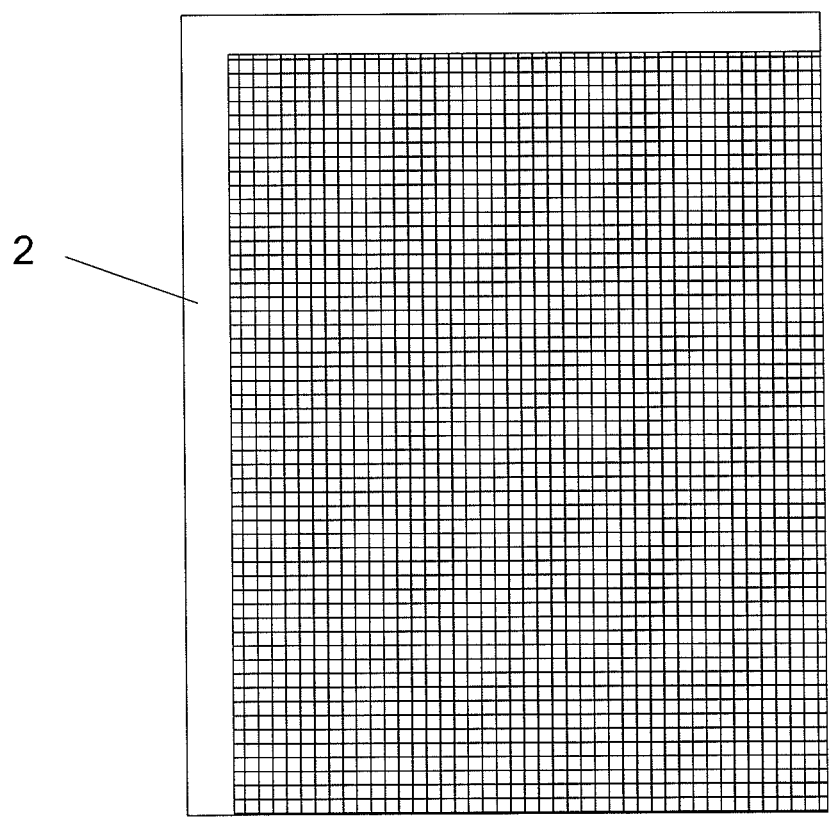
FIG. 2 is a schematic view of the glass substrate subjected to one exposure.
Figure 3:
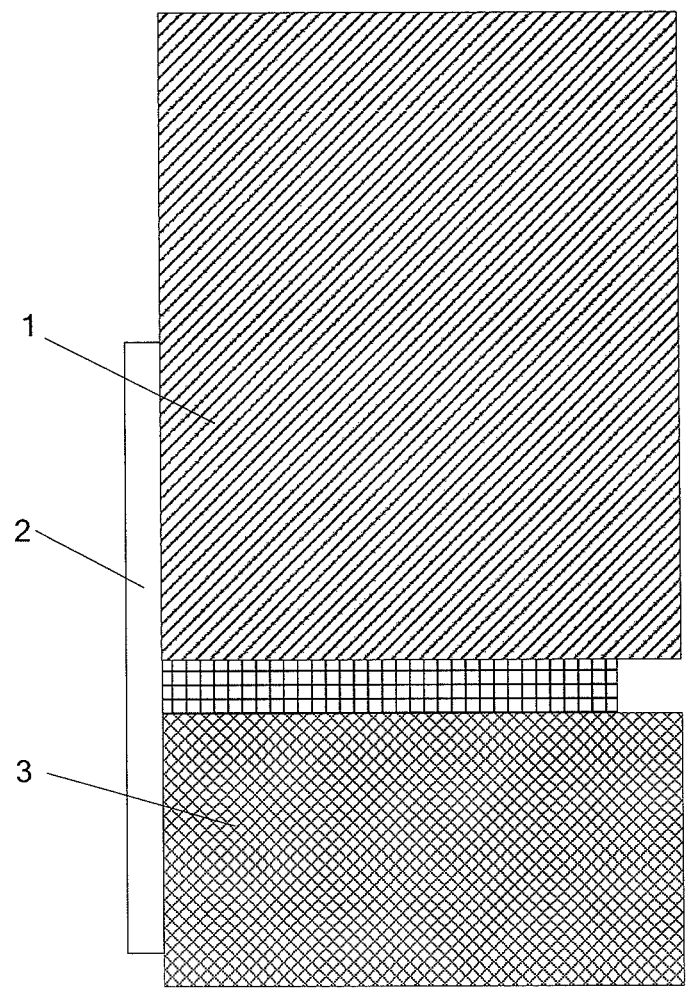
FIG. 3 is a schematic view of shading the glass substrate by using the mask and a light blocking strip of an exposure apparatus.
Figure 4:
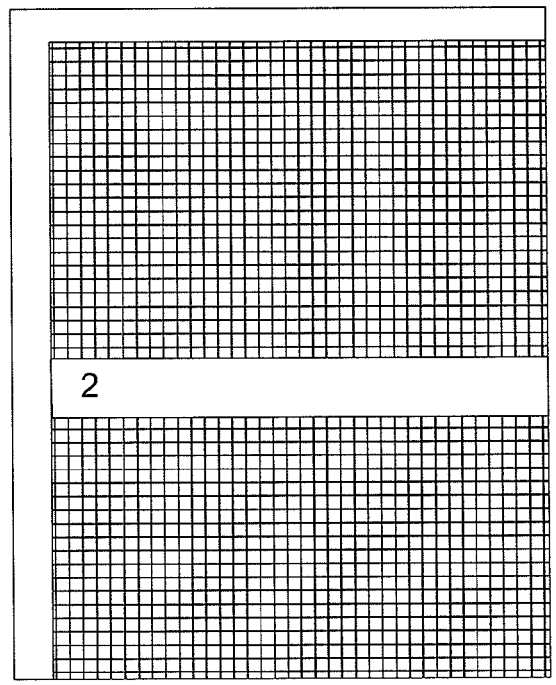
FIG. 4 is a schematic view of the glass substrate subjected to two exposures.
Figure 5:
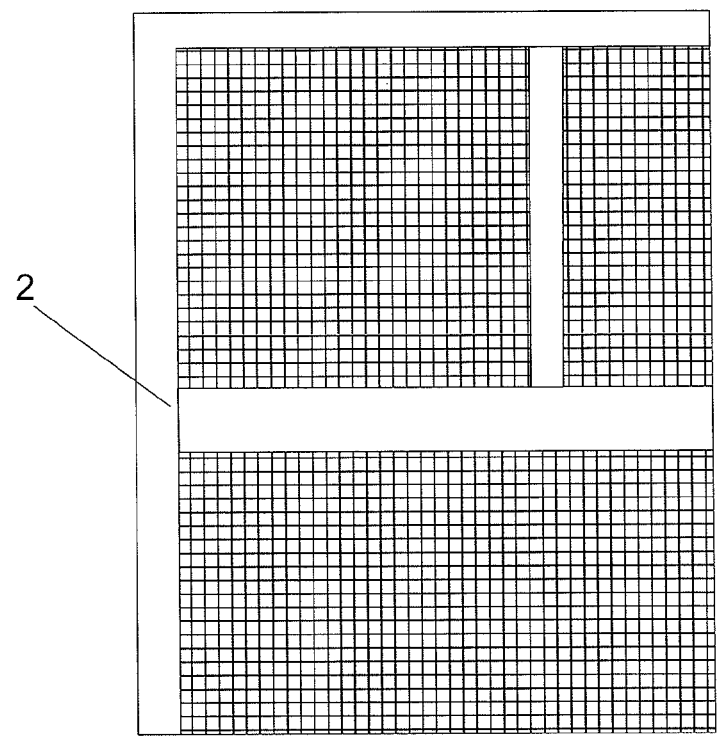
FIG. 5 is a schematic view of the glass substrate subjected to three exposures.
Figure 6:
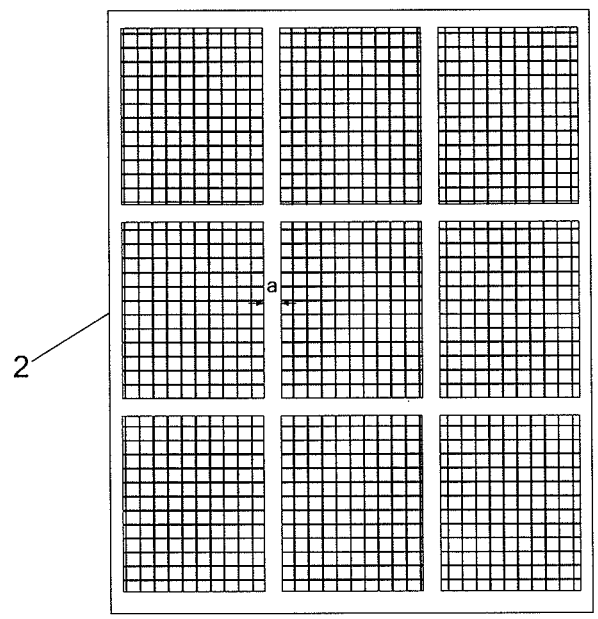
FIG. 6 is a schematic view of the finally obtained glass substrate subjected to multiple exposures.
Figure 7:
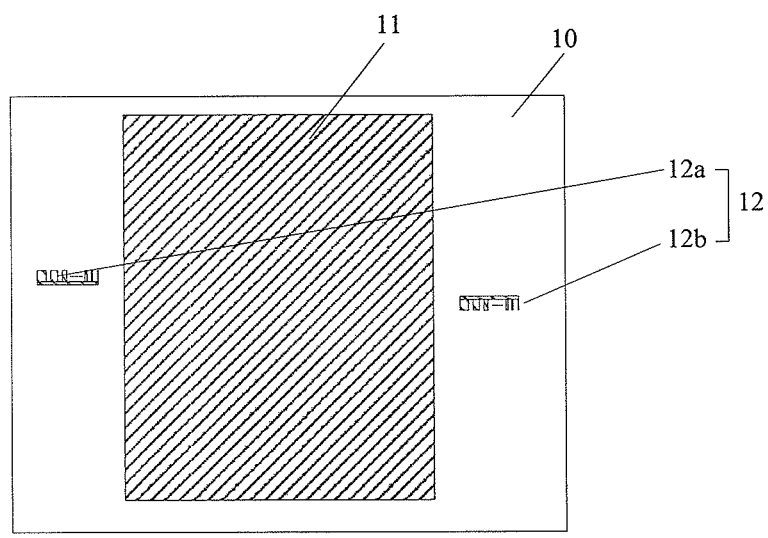
FIG. 7 is a schematic top view of a mask according to an embodiment of the present invention.

FIG. 7 is a schematic top view of a mask according to an embodiment of the present invention. As shown in FIG. 7, on a mask 10 according to an embodiment of the present invention, a preset pattern 11 is provided, and a first test pattern 12 is provided at each of two opposite sides of the preset pattern 11. The first test patterns 12 are used for determining an amount of position offset of the mask 10 during its movement. Preferably, the preset pattern 11 is a rectangle. The preset pattern 11 is provided on the mask 10 in such a way that portions of the mask 10 at two opposite sides of the preset pattern 11 have enough spaces to arrange the first test patterns 12, respectively. Preferably, the preset pattern 11 is provided on a central portion of the mask 10. The first test patterns 12 include a first test pattern 12a provided at a first side of the preset pattern 11 and a first test pattern 12b provided at a second side of the preset pattern 11 opposite to the first side. In the present invention, the first test pattern 12a and the first test pattern 12b will be collectively referred to as the first test patterns 12 in a case that it is not necessary to distinguish them from each other.

When a plurality of regions of a glass substrate are exposed successively by using the mask 10, the mask 10 is moved in a direction from the first side to the second side (i.e., the direction from the left to the right in FIG. 7) by a preset distance. Then, it can be determined whether the mask 10 has a position offset during its movement, by determining whether an actual position correspondence relationship between a pattern formed by exposing a glass substrate using the first test pattern 12a after the mask 10 is moved and a pattern formed by exposing a glass substrate using the first test pattern 12b before the mask 10 is moved is consistent with a preset correspondence relationship or not (for example, the preset correspondence relationship may be that the pattern formed by exposing the glass substrate using the first test pattern 12a after the mask 10 is moved and the pattern formed by exposing the glass substrate using the first test pattern 12b before the mask 10 is moved are aligned with each other, as the correspondence relationship between the pattern 12a″ and the pattern 12b′ in FIG. 9). If they are determined to be consistent, it can be determined no position offset occurs to the mask 10 during its movement. If they are determined to be inconsistent, it can be determined that a position offset occurs to the mask 10 during its movement, and an amount of the position offset of the mask 10 can be determined by comparing the actual correspondence relationship with the preset correspondence relationship.

Figure 8:
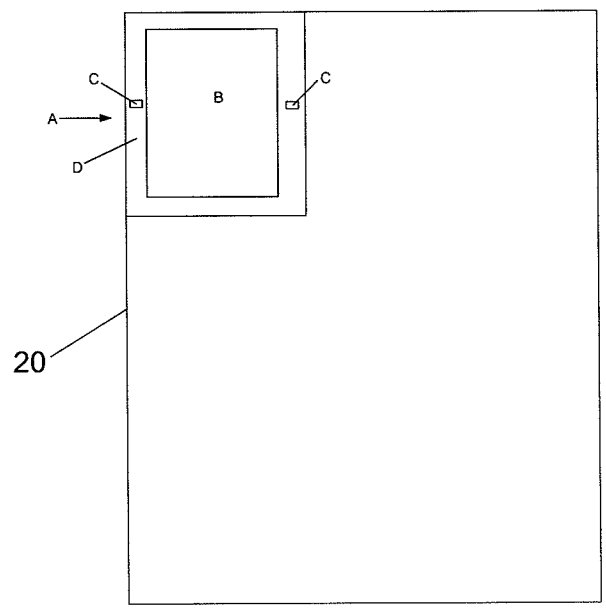
FIG. 8 is a schematic top view of a glass substrate.

In the present embodiment, the mask 10 is used to manufacture a glass substrate 20 having a predetermined pattern. FIG. 8 is a schematic top view of a glass substrate. Specifically, an opaque metal layer is deposited on a glass substrate 20, and a layer of photoresist is coated on the opaque metal layer. In manufacturing the glass substrate 20 having a predetermined pattern, the layer of photoresist on the glass substrate 20 needs to be exposed. Before exposure, the mask 10 is placed right above a region A of the glass substrate 20, and meanwhile, the other region than the region A of the glass substrate 20 is shaded. Then, the region A is exposed, so that in the region A, the photoresist in a region B which corresponds to the preset pattern 11 of the mask 10 and the photoresist in regions C which correspond to the first test patterns 12 is insoluble in a developer, whereas the photoresist in other region D is soluble in the developer. Subsequently, the mask 10 is moved to above other regions of the glass substrate 20 to expose the corresponding regions successively. Finally, the photoresist in a region corresponding to a predetermined pattern on the glass substrate 20 is insoluble in the developer, whereas the photoresist outside the region corresponding to the predetermined pattern is soluble in the developer. Furthermore, in a subsequent step, the photoresist outside the region corresponding to the predetermined pattern on the glass substrate 20 may be removed through developing, while the photoresist in the region corresponding to the predetermined pattern remains on the glass substrate 20.

Hereinafter, the principle and the process for detecting a position offset of the mask 10 during its movement by using the mask 10 according to the present invention will be described in detail with reference to the accompanying drawings.

Figure 9:
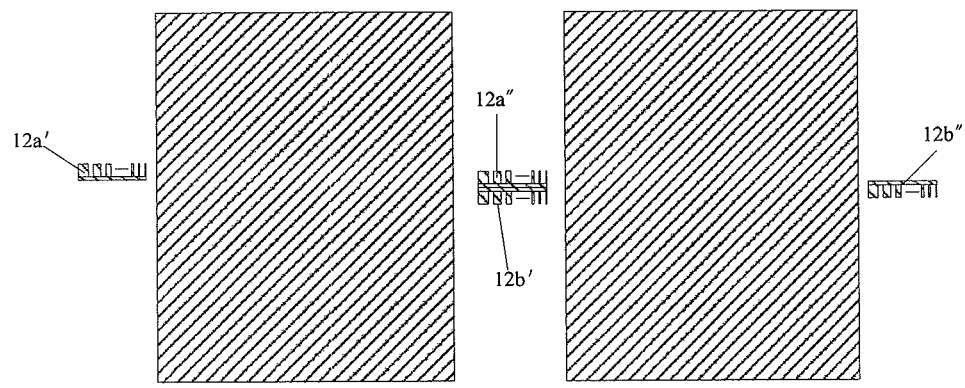
FIG. 9 is a schematic view of patterns formed on a substrate.
Figure 10:
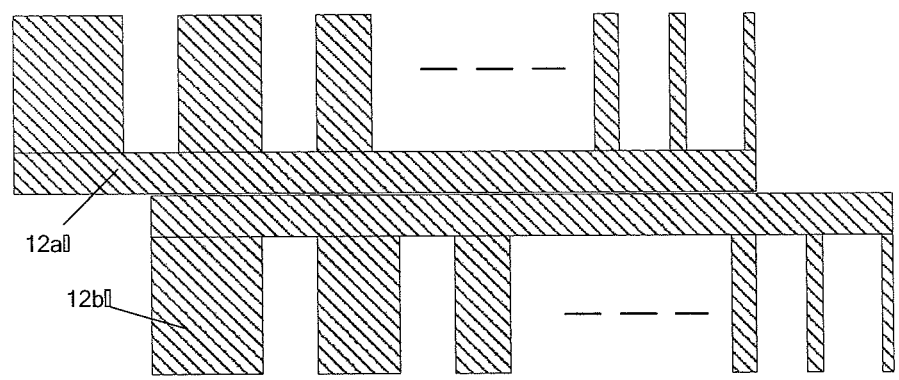
FIG. 10 is a schematic view of a case where patterns formed on a glass substrate have a position offset.

Specifically, as shown in FIG. 9, after a process of exposing the region A has been finished, two patterns 12a' and 12b' which respectively correspond to the first test patterns 12a and 12b are formed on the regions C. Meanwhile, after the process of exposing the region A has been finished, the mask 10 is moved in a first direction by a standard distance. In the present invention, the first direction is a direction from the first side to the second side of the preset pattern 11 (e.g., the direction from the left to the right in FIG. 9); the standard distance is a length of the projection of the distance between the left end of the first test pattern 12a and the left end of the first test pattern 12b (see FIG. 7) on a movement path of the mask 10. If a position correspondence relationship between the projections of a position where the first test pattern 12a is located after the mask 10 is moved by the standard distance and a position where the first test pattern 12b is located before the mask 10 is moved on the glass substrate 20 is consistent with a preset correspondence relationship, then in the subsequent exposure process, a position correspondence relationship between a pattern 12a'' corresponding to the first test pattern 12a and formed on the glass substrate 20 after the mask 10 is moved and a pattern 12b' corresponding to the first test pattern 12b and formed on the glass substrate 20 before the mask 10 is moved is consistent with the preset correspondence relationship, as shown in FIG. 9. Thus, in a practical application, if a position correspondence relationship between the pattern 12a'' and the pattern 12b' is inconsistent with the preset correspondence relationship as shown in FIG. 10, it can be determined that a position offset occurs to the mask 10 during its movement, that is, the moving distance of the mask 10 is not the standard distance. Furthermore, an amount of the position offset of the mask 10 during its movement can be determined by comparing the position correspondence relationship between the pattern 12a'' and the pattern 12b' with the preset correspondence relationship. In such a way, during a process of manufacturing the glass substrate 20, the position offset of the mask 10 during its movement can be corrected, to reduce the position offset of the mask 10 during its movement, so that the pattern formed on the glass substrate 20 can be consistent with the desired predetermined pattern as much as possible.

Figure 11:
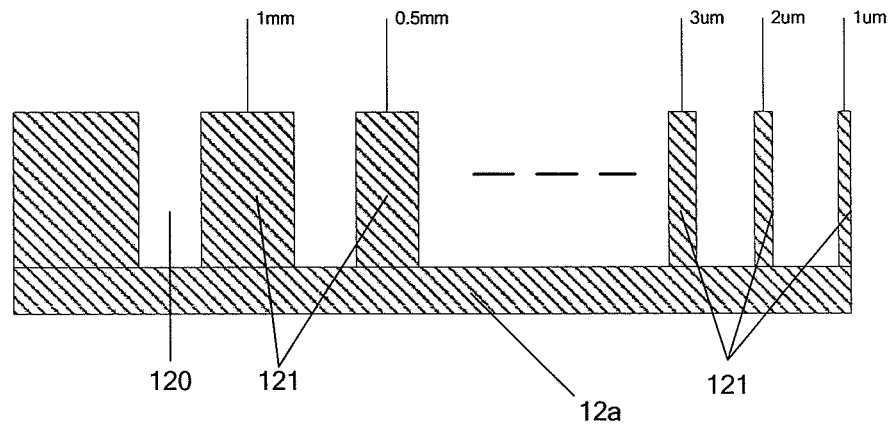
FIG. 11 is a schematic view of a first one of first test patterns.
Figure 12:
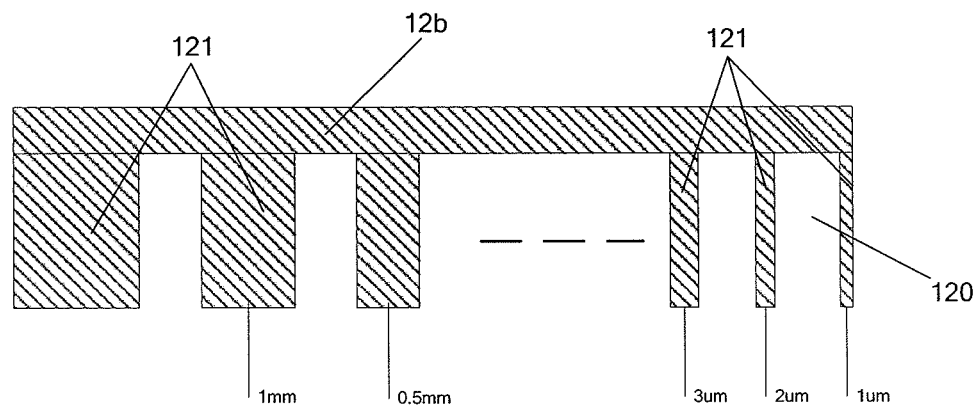
FIG. 12 is a schematic view of a second one of the first test patterns.

A plurality of tags 121 are provided on each of the first test patterns 12, and the plurality of tags 121 are used for determining the position correspondence relationship between the pattern 12a'' and the pattern 12b'. Preferably, the plurality of tags 121 are arranged in the first direction (i.e., the direction from the left to the right in FIGS. 11 and 12). Further, the tags 121 provided on the first test pattern 12a and the tags 121 provided on the first test pattern 12b are mirror-symmetric with respect to the first direction, so as to quickly and accurately determine the position correspondence relationship between the pattern 12a'' and the pattern 12b'. Specifically, in the present embodiment, the plurality of tags 121 are provided on each of the first test patterns 12, and the portion between any two adjacent tags 121 forms an opening 120, as shown in FIGS. 11 and 12. Further, a plurality of openings 120 formed by the plurality of tags 121 on each first test pattern 12 are all located at the same side of the first test pattern 12, that is, opening directions of the plurality of openings 120 are the same. In the present invention, the opening directions of openings 120 on each of the first test patterns 12 do not face towards the preset pattern 11 or a direction opposite to the preset pattern 11. With such arrangement, in a case where a position offset occurs to the mask 10 during its movement, an amount of offset between the pattern 12a'' and the pattern 12b' can be visually determined according to the number of the openings 120 by which the pattern 12a'' and the pattern 12b' are offset, and an amount of the position offset of the mask 10 during its movement is thus determined. Preferably, widths of all openings 120 on each of the first test patterns 12 are the same, and the opening directions of all openings 120 on each of the first test patterns 12 are perpendicular to the first direction, such that a user can determine the amount of a position offset of the mask 10 during its movement more accurately and more easily. Further preferably, the openings 120 are non-through holes which do not penetrate through the first test patterns 12.

Preferably, projections of the first test pattern 12a and the first test pattern 12b on a direction parallel to the opening direction of the openings 120 are in contact with each other, or a distance between the projections is less than a preset value. Such arrangement leads to that the pattern 12a'' and the pattern 12b' formed on the glass substrate 20 through exposure are in contact with each other or a distance therebetween is small, thus a user can determine an amount of offset between the pattern 12a'' and the pattern 12b' easily, as shown in FIG. 10. For the same reasons, in the present embodiment, preferably, in the above first test patterns 12, the opening direction of the openings 120 on the first test pattern 12a is opposite to the opening direction of the openings 120 on the first test pattern 12b, as shown in FIGS. 11 and 12. Thus, an amount of offset between two patters 12a'' and 12b' can be determined easily, as shown in FIG. 10.

In the present embodiment, preferably, the plurality of tags 121 on the first test patterns 12 have different preset widths. Further, the preset widths of tags 121 on each of the first test patterns 12 progressively increase or progressively decrease in the first direction, as shown in FIGS. 11 and 12. Specifically, among the preset widths of the tags 121 (i.e., distances between the two adjacent openings 120), the minimum value is 1.0 μm, and the maximum value is 3.0 mm. In other words, the widths of the tags 121 range from 1.0 μm to 3.0 mm. In a practical application, it can be determined whether an exposure intensity during an exposure process is so high that it has an adverse effect on dimensional accuracy of a pattern formed on the glass substrate 20 according to the shapes of a plurality of hole walls in the pattern formed on the glass substrate 20 after exposure. For example, if a certain tag 121 disappears from a pattern corresponding to the first test patterns 12 and formed on the glass substrate 20, it can be determined whether the exposure intensity during the exposure process is too high according to the value of the width of said tag 121. Specifically, a method for determining whether an exposure intensity is too high may be as follows. Since the order of magnitude of the size of a light blocking pattern finally formed is of centimeter, and it is difficult to detect the exposure intensity, it is necessary to use the mask according to the present invention to control the exposure intensity. For example, If a tag with 1 μm disappears, it can be determined that the exposure intensity is greater than an amount of energy required for the tag with 1 μm. Thus, it can be determined that an edge of the light blocking pattern is overexposed by 1 μm. If the exposure intensity is too high, the exposure intensity needs to be reduced, so that a pattern formed on the glass substrate 20 can have a better dimensional accuracy in a subsequent exposure process.

When being moved in the first direction (a direction from the first side of the preset pattern 11 at which the first test pattern 12 is located to the second side of the preset pattern 11 which is opposite to the first side) by the standard distance, the mask according to the present invention can determine whether a position offset occurs to the mask 10 during its movement, by determining whether an actual correspondence relationship between a position of the first test pattern 12a located at the first side of the preset pattern 11 after the mask 10 is moved and a position of the first test pattern 12*b* located at the second side of the preset pattern 11 before the mask 10 is moved is consistent with a preset correspondence relationship or not. If they are determined to be consistent, it is determined that no position offset occurs to the mask 10 during its movement. If they are determined to be inconsistent, it is determined that a position offset occurs to the mask 10 during its movement, and an amount of the position offset of the mask 10 during its movement can be determined by comparing the actual correspondence relationship with the preset correspondence relationship. Thus, the position offset of the mask 10 can be corrected according to the amount of the position offset, thereby obtaining an accurate predetermined pattern on the glass substrate 20.

Figure 13:
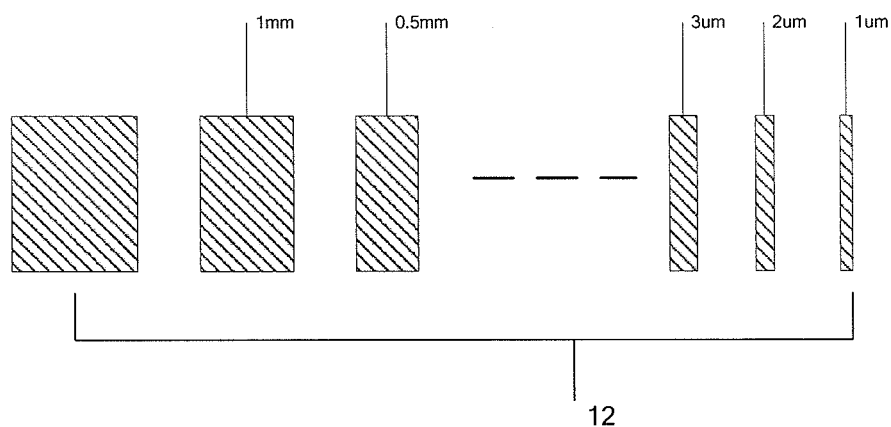
FIG. 13 is a schematic view of a case where an opening is a through hole.

It should be noted that, in the present embodiment, the openings 120 are non-through holes which do not penetrate through the first test patterns 12. However, the present invention is not limited thereto. In a practical application, the openings 120 may be through holes, as shown in FIG. 13.

It should also be noted that, in the present embodiment, a plurality of openings 120 are provided on both of the first test patterns 12 located at two opposite sides of the preset pattern 11. However, the present invention is not limited thereto. In a practical application, it only needs to provide a plurality of openings 120 on a first test pattern 12 located at one side of the preset pattern 11. Thus, manufacturing steps of the mask 10 can be simplified, thereby reducing manufacturing cost of the mask 10.

Figure 14:
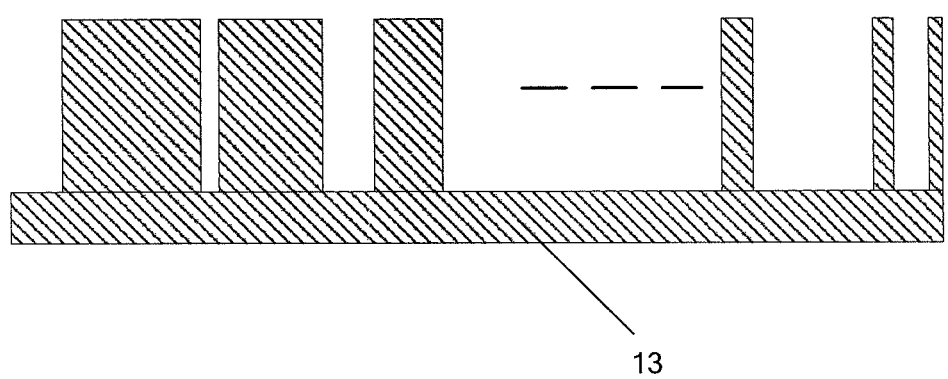
FIG. 14 is a schematic view of a second test pattern.
Figure 15:
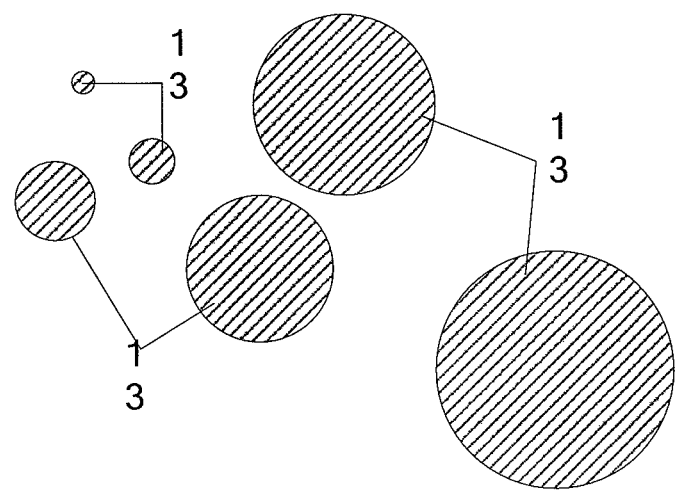
FIG. 15 is another schematic view of a second test pattern.

Further, in the present embodiment, the widths of tags 121 on each of the first test patterns 12 progressively increase or progressively decrease in the first direction. However, the present invention is not limited thereto. In a practical application, the widths of tags 121 on each of the first test patterns 12 may be the same. In such a case, a plurality of second test patterns 13 may be provided in a peripheral region of the mask 10, and each of the plurality of second test patterns 13 includes a plurality of figures having different sizes. For example, a plurality of second test patterns 13 may be provided in a peripheral region of the mask 10, which is 10 mm to 15 mm away from the edge of the mask 10. For example, six second test patterns 13 may be provided on each short side and each long side of the mask 10, respectively, that is, a total of 24 second test patterns 13 are provided in the peripheral region of the mask 10. As such, the subsequent process will not be affected, while the purpose of testing is achieved. During an exposure process, it can be determined whether an exposure intensity during the exposure process is too high according to patterns formed by the plurality of figures having different sizes after exposure, and a method for determining whether the exposure intensity is too high may be the one as described above. For example, the plurality of figures may be connected to each other as a whole, as shown in FIG. 14. Alternatively, the plurality of figures may be provided on the mask 10 separate from each other, as shown in FIG. 15. Preferably, as shown in FIGS. 14 and 15, each of the figures may be a rectangle or a circle. In this case, a size of the rectangle refers to a width of the rectangle, and a size of the circle refers to a diameter of the circle. The sizes of the plurality of figures range from 1.0 µm to 3.0 mm.

It should be understood that, the foregoing embodiments are only exemplary embodiments used for explaining the principle of the present invention, but the present invention is not limited thereto. Various variations and improvements may be made by a person skilled in the art without departing from the protection scope of the present invention, and these variations and improvments also fall into the protection scope of the present invention.

What is claimed is:

1. A mask, on which a preset pattern is provided, wherein, first test patterns for determining an amount of a position offset of the mask during its movement are provided on the mask at a first side of the preset pattern and a second side of the preset pattern opposite to the first side, respectively, wherein, each of the first test patterns is provided with a plurality of tags which are arranged in a first direction from the first side to the second side, and the tags in the first test pattern located at the first side and the tags in the first test pattern located at the second side are mirror-symmetric with respect to the first direction, wherein, the plurality of tags have different preset widths, and the preset widths of the tags in each of the first test patterns progressively increase or progressively decrease in the first direction;

wherein the preset widths of the tags in each of the first test patterns range from 1.0 µm to 3.0 mm;

wherein the plurality of tags provided on the first test patterns at the first side and the second side of the preset pattern comprise openings between adjacent tags, wherein the openings are non-through holes which do not penetrate through the first test patterns, and wherein the openings on the first side of the preset pattern are in a direction opposite the openings on the second side of the preset pattern.

2. The mask according to claim 1, wherein, the preset pattern is provided on a central portion of the mask.

3. The mask according to claim 2, wherein, a portion between any two adjacent tags in each of the first test patterns forms an opening, and opening directions of a plurality of formed openings are the same.

4. The mask according to claim 3, wherein, widths of the plurality of openings are the same.

5. The mask according to claim 3, wherein, the first direction is perpendicular to the opening direction of the plurality of openings.

6. The mask according to claim 1, wherein, the preset pattern is a rectangle.

7. The mask according to claim 1, wherein, a plurality of second test patterns are further provided in a peripheral region of the mask, each of the plurality of second test patterns includes a plurality of figures having different sizes, and the plurality of figures are used for determining an exposure intensity.

8. The mask according to claim 7, wherein, all of the plurality of figures are rectangles or circles.

9. The mask according to claim 7, wherein, sizes of the plurality of figures range from 1.0 µm to 3.0 mm.

* * * * *